(12) United States Patent
Huang et al.

(10) Patent No.: US 10,972,830 B1
(45) Date of Patent: Apr. 6, 2021

(54) SPEAKER MONOMER WITH PAIR OF DYNAMIC SPEAKERS THEREOF

(71) Applicant: Shenzhen Ginto E-Commerce Co., Limited, Shenzhen (CN)

(72) Inventors: Jianhua Huang, Shenzhen (CN); Jin Yang, Shenzhen (CN)

(73) Assignee: SHENZHEN GINTO E-COMMERCE CO., LIMITED, Shenzhen (CN)

( * ) Notice: Subject to any disclaimer, the term of this patent is extended or adjusted under 35 U.S.C. 154(b) by 0 days.

(21) Appl. No.: 16/745,393

(22) Filed: Jan. 17, 2020

(30) Foreign Application Priority Data

Jan. 3, 2020 (CN) .......................... 202010007135.6

(51) Int. Cl.
| | |
|---|---|
| H04R 1/24 | (2006.01) |
| H04R 9/02 | (2006.01) |
| H05K 7/14 | (2006.01) |
| H05K 1/18 | (2006.01) |
| H04R 7/12 | (2006.01) |
| H04R 3/14 | (2006.01) |
| H04R 1/02 | (2006.01) |
| H04R 9/06 | (2006.01) |

(52) U.S. Cl.
CPC ............. *H04R 1/24* (2013.01); *H04R 1/025* (2013.01); *H04R 3/14* (2013.01); *H04R 7/127* (2013.01); *H04R 9/025* (2013.01); *H04R 9/06* (2013.01); *H05K 1/181* (2013.01); *H05K 7/1427* (2013.01); *H04R 2400/11* (2013.01); *H05K 2201/10083* (2013.01)

(58) Field of Classification Search
None
See application file for complete search history.

(56) References Cited

U.S. PATENT DOCUMENTS

| | | | |
|---|---|---|---|
| 2006/0159296 A1* | 7/2006 | Kobayashi | H04R 5/02 381/300 |
| 2008/0192976 A1* | 8/2008 | Kim | H04R 9/06 381/412 |
| 2020/0029147 A1* | 1/2020 | Chou | H04R 1/1075 |

* cited by examiner

*Primary Examiner* — James K Mooney

(57) ABSTRACT

The present disclosure provided a speaker monomer with a pair of dynamic speakers thereof includes a housing, an electro-acoustic conversion member received in the housing, and a PCB. The electro-acoustic conversion member includes a first dynamic speaker and a second dynamic speaker, and the housing is a double-barrel-shaped configuration and includes a first receiving room for receiving the first dynamic speaker therein, and a second receiving room arranged in parallel and separated from the first receiving room for receiving the second dynamic speaker therein. The PCB is installed in an end portion of the housing and electrically connected to the first and second dynamic speakers. The present disclosure not only can improve sound quality of an ear-in earphone, but also can reduce a volume of the ear-in earphone, improve assembly efficiency and reduce a defective rate of the ear-in earphone.

7 Claims, 4 Drawing Sheets

SPEAKER MONOMER WITH PAIR OF DYNAMIC SPEAKERS THEREOF

BACKGROUND

1. Technical Field

The present disclosure generally relates to earphones field, and especially relates to a speaker monomer with a pair of dynamic speakers thereof.

2. Description of Related Art

A micro-speaker is mainly used in an ear-in earphone. Most ear-in earphones are generally provided a speaker monomer with a sound unit (a dynamic speaker or a moving iron unit) arranged on a side thereof for producing sound to meet a basic sound demand.

In order to improve sound quality of the ear-in earphone, some of the ear-in earphones on the market include a pair of sound units received inside a single earphone of the ear-n earphone to enhance the sound quality of the ear-in earphone.

However, a conventional single earphone with a pair of sound units thereof has disadvantages shown below:

1. Large volume: at present, due to only one sound unit being equipped within a speaker monomer. Therefore, it is needed to arrange two speaker monomers if a single earphone is equipped with a pair of sound units, which needs an enough space to receive the pair of speaker monomers in the single earphone. Therefore, a larger volume of the single earphone is needed.

2. High defective rate: because a pair of speaker monomers is equipped within the single earphone so that four speaker monomers are needed to be arranged in left and right earphones. In this way, the sound units received in the four speaker monomers should be consistent enough to ensure the sound quality of the product, if the sound units of any one speaker monomer are defective, the whole earphone is defective.

3. Difficult assemble: during assembling this kind of speaker, the four speaker monomers need to be installed, respectively, thereby the assembly process is needed to be repeated for four times, which is time-consuming and labor-intensive.

Therefore, an improve speaker monomer to overcome the problems mentioned above is needed.

SUMMARY

The technical problems to be solved: in view of the shortcomings of the related art, the present disclosure relates to a speaker monomer with a pair of dynamic speakers thereof which can not only improve sound quality and an assembly efficiency of an ear-in earphone, but also reduce a volume and a defective rate of the ear-in earphone.

The technical solution adopted for solving technical problems of the present disclosure is: a speaker monomer with a pair of dynamic speakers thereof includes a housing, an electro-acoustic conversion member received in the housing, and a PCB. The electro-acoustic conversion member includes a first dynamic speaker and a second dynamic speaker, and the housing is a double-barrel-shaped configuration and includes a first receiving room for receiving the first dynamic speaker therein, and a second receiving room arranged in parallel and separated from the first receiving room for receiving the second dynamic speaker therein. The PCB is installed in an end portion of the housing and electrically connected to the first and second dynamic speakers.

Wherein a cross section of the housing is in a shape of "8".

Wherein each of the first dynamic speaker and the second dynamic speaker includes a yoke iron, a permanent magnet, a pole, a voice coil electrically connected to the PCB, a dome, a ring and a cover successively received in the first and second dynamic speakers from top to bottom; both the permanent magnet and the pole are hollow inside to form a moving chamber therein, the voice coil fixed on the dome and embedded into the moving chamber; the yoke iron including a base closely arranged on the permanent magnet, and a post protruding downward from the base, received in the moving chamber and surrounded by the voice coil.

Wherein each of the first receiving room and the second receiving room includes an upper cavity, a lower cavity and a spacer separating the upper cavity from the lower cavity, and all of the yoke iron, the permanent magnet and the pole closely arranged in the upper cavity from top to bottom, and a lower portion of the pole connected with a top surface of the spacer, all of the dome, the ring and the cover installed in the lower cavity from top to bottom, an upper surface of the dome connected with a bottom surface of the spacer and a lower surface of the dome connected with an upper portion of the ring, the cover and the ring spaced from each other, and the voice coil extending into the upper cavity.

Wherein the upper cavity includes a limiting recess, an edge of the base embedded into the limiting recess.

Wherein the PCB includes a connecting board formed in a middle portion thereof, and a pair of circular boards formed on two opposite ends of the connecting board and respectively received in the first receiving room and the second receiving room and positioned above the base of the yoke iron.

Wherein the pair of circular boards includes a first through-hole passing therethrough along an axial direction of the speaker monomer, and the post includes a second through-hole passing therethrough along the axial direction of the speaker monomer and coaxially connected with the first through-hole.

Wherein the housing further includes a pair of installing recesses respectively formed on a corresponding outer sidewall of the first receiving room and the second receiving room.

Wherein the PCB further includes a crossover circuit configured to transform an input audio signal into signals with different frequencies and then send the signals with different frequencies to the first dynamic speaker and the second dynamic speaker, respectively.

The present disclosure provides the advantages as below.

The structure of the present disclosure is provided that a pair of dynamic speakers is received in a speaker monomer and the pair of dynamic speakers is configured to share a same housing and a same PCB for audio playback, so that only one installation position of the speaker monomer can be needed in a single-side ear-in earphone to reduce a volume of the ear-in earphone. At the same time, the single-side ear-in earphone is only needed to install the speaker monomer once, which can improve installation efficiency and product yield of the product.

BRIEF DESCRIPTION OF THE DRAWINGS

In order to more clearly understand the technical solution hereinafter in embodiments of the present disclosure, a brief description to the drawings used in detailed description of embodiments hereinafter is provided thereof. Obviously, the drawings described below are some embodiments of the present disclosure, for one of ordinary skill in the related art, other drawings can be obtained according to the drawings below on the premise of no creative work.

Figure 1:
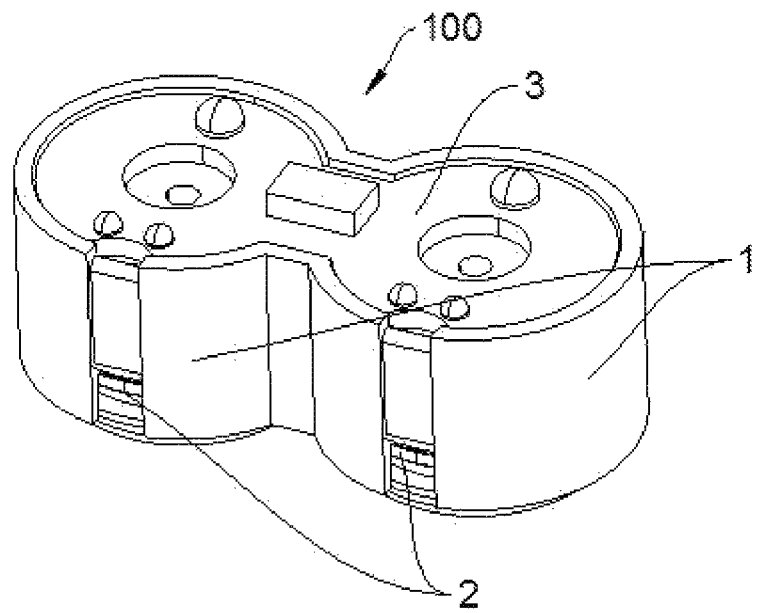
FIG. 1 is a schematic view of a speaker monomer with a pair of dynamic speakers thereof in accordance with an embodiment of the present disclosure.
Figure 2:
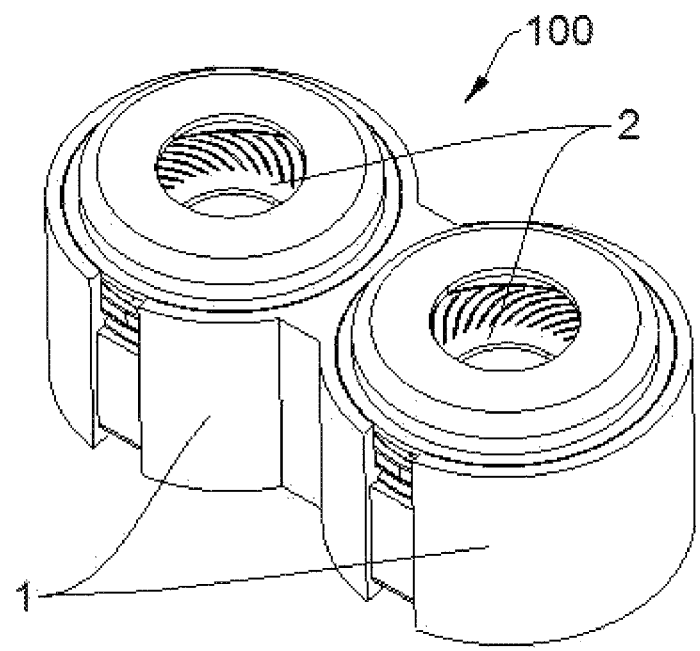
FIG. 2 is similar to FIG. 1, but shown from another view.

The element labels according to the exemplary embodiment of the present disclosure shown as below: speaker monomer 100, housing 1, first receiving room 10a, second receiving room 10b, upper cavity 11, lower cavity 12, spacer 13, top surface 131, bottom surface 132, limiting recess 14, installing recess 15, electro-acoustic conversion member 2, first dynamic speaker 20a, second dynamic speaker 20b, yoke iron 21, base 211, post 212, second through-hole 2121, permanent magnet 22, pole 23, lower portion 231, voice coil 24, dome 25, upper surface 251, lower surface 252, ring 26, upper portion 261, cover 27, moving chamber 28, PCB 3, connecting board 31, circular board 32, first through-hole 33, crossover circuit 34.

DETAILED DESCRIPTION

Reference will now be made in detail to embodiments, examples of which are illustrated in the accompanying drawings. In the following detailed description, numerous specific details are set forth in order to provide a thorough understanding of the subject matter presented herein. Obviously, the implementation embodiment in the description is a part of the present disclosure implementation examples, rather than the implementation of all embodiments, examples. According to the described embodiment of the present disclosure, all other embodiments obtained by one of ordinary skill in the related art on the premise of no creative work are within the protection scope of the present disclosure.

In the description of the present disclosure, it needs to be explained that all the directional indicators (such as the terms: "upper", "below", "left", "right", "front", "back" . . . ), are shown in the specification of the present disclosure. The indicated orientation or position of the terms shown in the detailed description is based on the orientation or position shown in the figures of the accompanying drawings of the present disclosure, which is only to easily simplify the description of the present disclosure, but not indicated that the devices or elements of the present disclosure should have a particular orientation or should be designed and operated in a particular orientation. So the terms illustrated in the detail description are not by way of the limitation of the present disclosure.

In the description of the present disclosure, except where specifically otherwise illustrated or limited, the terms "connect" and "link" used herein should be understood in a broad sense. Such as, the meaning may be tight connection, removable connection, or integrated connection. The meaning may also be mechanical connection, electrical connection, direct connection or indirect connection through intermediaries, or internal connection within two elements. The meaning of the terms used herein may be understood by one of ordinary skill in the related art according to specific conditions of the present disclosure.

Furthermore, in the description of the present disclosure, the terms such as "first" and "second" shown in the specification are only used to describe, but not indicated that the elements of the present disclosure is important or represented the amount of the elements. That is, the features limited by the terms of "first" and "second" may explicitly or implicitly include one or more features.

Referring to FIGS. 1-5, a speaker monomer with a pair of dynamic speakers thereof in accordance with an embodiment includes a housing 1, an electro-acoustic conversion member 2 received in the housing 1, and a PCB 3. The PCB 3 includes a control circuit configured to control change of an electrical signal and input the electrical signal into the electro-acoustic conversion member 2 to realize an electro-acoustic conversion of the electrical signal.

The electro-acoustic conversion member 2 includes a first dynamic speaker 20a and a second dynamic speaker 20b so as to improve the sound quality of audio output from the speaker monomer 100. Both the first dynamic speaker 20a and the second dynamic speaker 20b can be configured to output audio with same frequencies or different frequencies.

Figure 3:
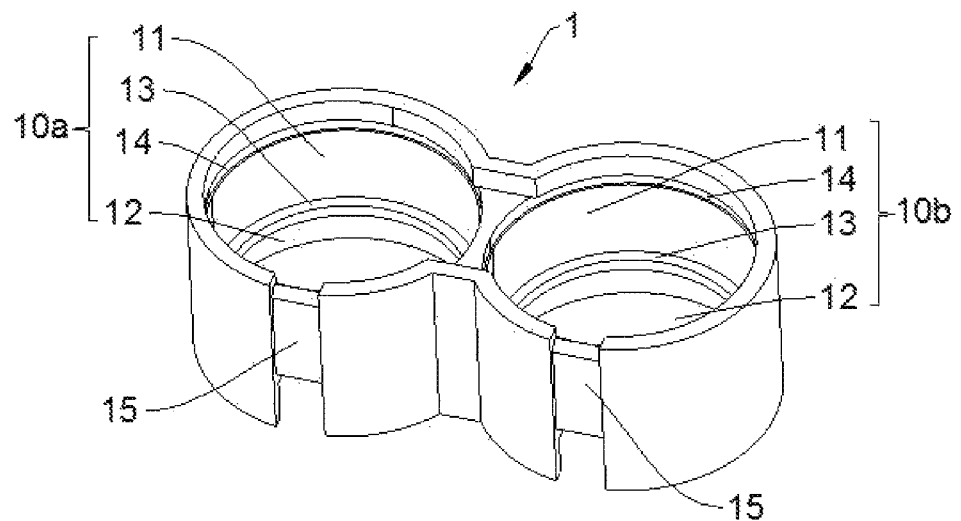
FIG. 3 is a schematic view of a housing of the speaker monomer with a pair of dynamic speakers thereof of FIG. 1.

Referring to FIG. 3, the housing 1 is a double-barrel-shaped configuration and includes a first receiving room 10a for receiving the first dynamic speaker 20a therein, and a second receiving room 10b arranged in parallel and separated from the first receiving room 10a for receiving the second dynamic speaker 20b therein. The first receiving room 10a and the second receiving room 10b arranged in parallel can reduce an overall height of the housing 1 so as to conveniently install the first dynamic speaker 20a and the second dynamic speaker 20b. At the same time, an intermediate spacing setting form between the first dynamic speaker 20a and the second dynamic speaker 20b can avoid a mutual interference after installing the first dynamic speaker 20a and the second dynamic speaker 20b.

The PCB 3 is installed in an end portion of the housing 1 and electrically connected to the first dynamic speaker 20a and the second dynamic speaker 20b. In this way, not only a transverse width of the housing 1 can be reduced, but also the first dynamic speaker 20a and the second dynamic speaker 20b can be uniformly controlled, thereby a PCB provided for a single dynamic speaker can be avoided so as to reduce resource waste and space occupation.

Compared with the related art, a single speaker monomer is equipped with only one sound unit (a dynamic speaker or a moving iron unit), the present disclosure is provided a pair of dynamic speakers within the speaker monomer 100, which can improve the sound quality of the ear-in earphone and only one installation position of the speaker monomer 100 can be needed in the single-side ear-in earphone to reduce the volume of the ear-in earphone. At the same time, the single-side ear-in earphone is only needed to install the speaker monomer once, which can improve installation efficiency and product yield of the product.

Furthermore, referring to FIG. 3, in an embodiment of the present disclosure, a cross section of the housing 1 is in a shape of "8". That is, the housing 1 is a double-barrel-shaped configuration, which can further reduce an outer dimension of the speaker monomer 100, and conveniently install the speaker monomer 100 within the ear-in earphone.

Figure 5:
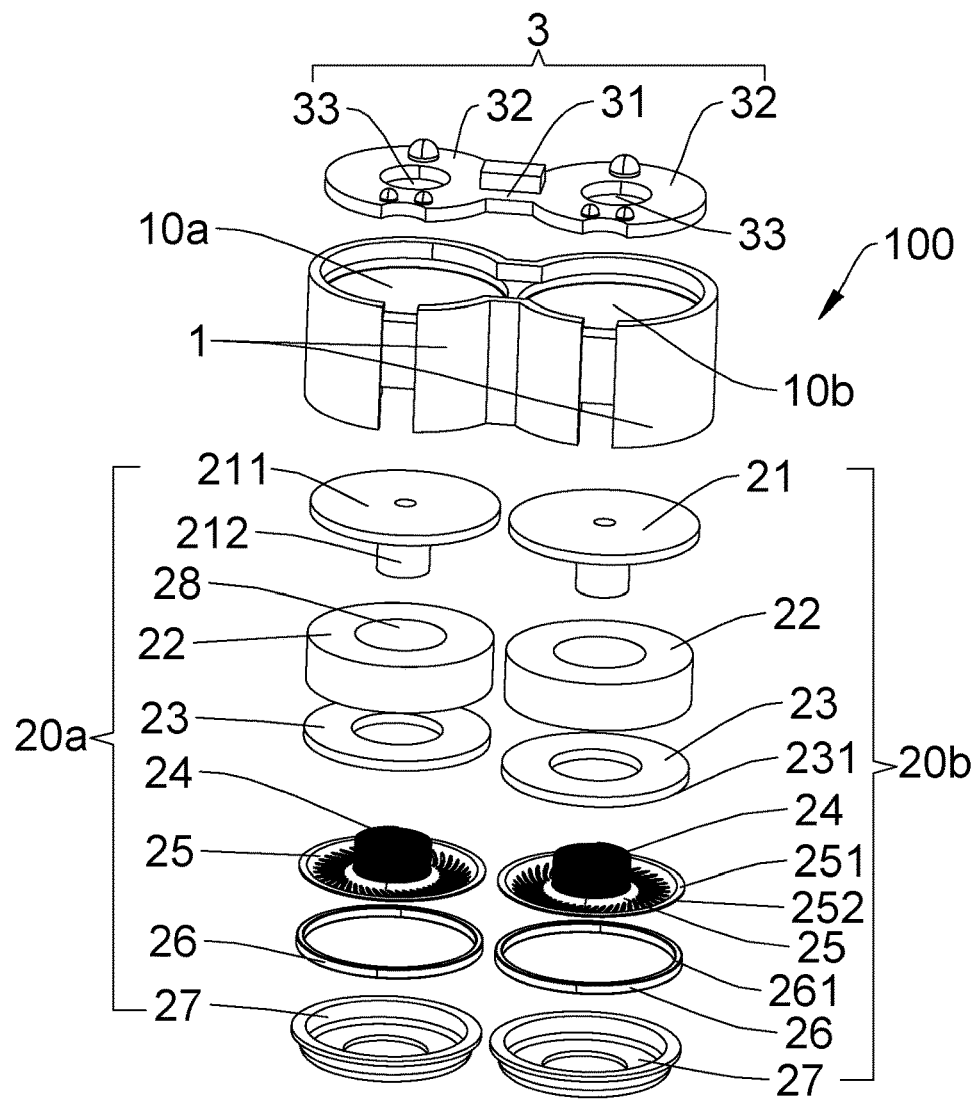
FIG. 5 is an exploded, schematic view of the speaker monomer with a pair of dynamic speakers thereof of FIG. 1.
Figure 6:
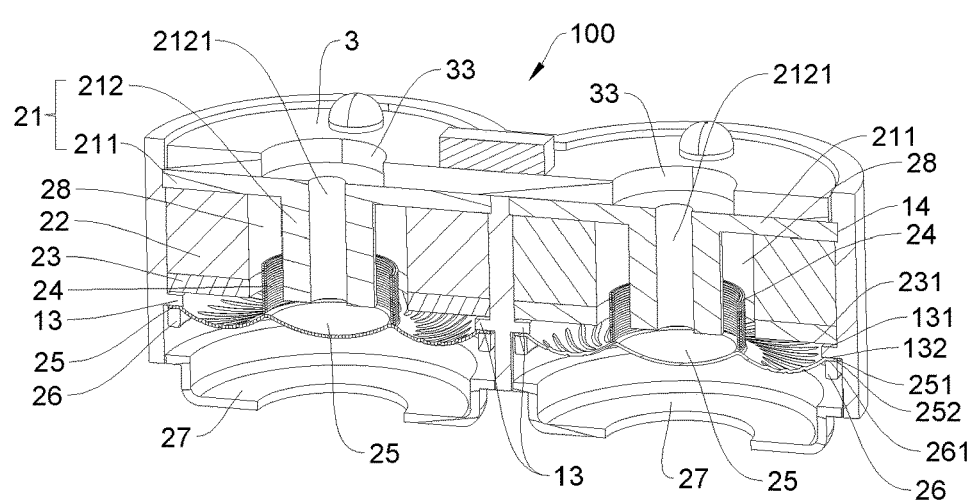
FIG. 6 is a cross sectional view of the speaker monomer with a pair of dynamic speakers thereof of FIG. 1.

Specifically, referring to FIG. 5 and FIG. 6, each of the first dynamic speaker 20a and the second dynamic speaker 20b includes a yoke iron 21, a permanent magnet 22, a pole 23, a voice coil 24, a dome 25, a ring 26 and a cover 27 successively received in the first dynamic speaker 20a and the second dynamic speaker 20b from top to bottom, respectively. The yoke iron 21 and the pole 23 are configured for magnetic conductivity, and the permanent magnet 22 is configured for magnetic field generation. The ring 26 is configured to press the dome 25, and the cover 27 is configured to protect the dome 25.

Both the permanent magnet 22 and the pole 23 are hollow inside to form a moving chamber 28 therein. The voice coil 24 is fixed on the dome 25 and embedded into the moving chamber 28. The yoke iron 21 includes a base 211 closely arranged on the permanent magnet 22, and a post 212 protruding downward from the base 211, received in the moving chamber 28 and surrounded by the voice coil 24. The voice coil 24 is a coil structure and electrically connected with PCB 3. A current and a current direction of the voice coil 24 can be changed after the voice coil 24 is energized. The change of the current is interacted with a magnetic field generated by the permanent magnet 22 to drive the voice coil 24 to move up and down within the moving chamber 28 so that the dome 25 is driven by the voice coil 24 moving up and down to vibrate and produce sound through air.

Figure 4:
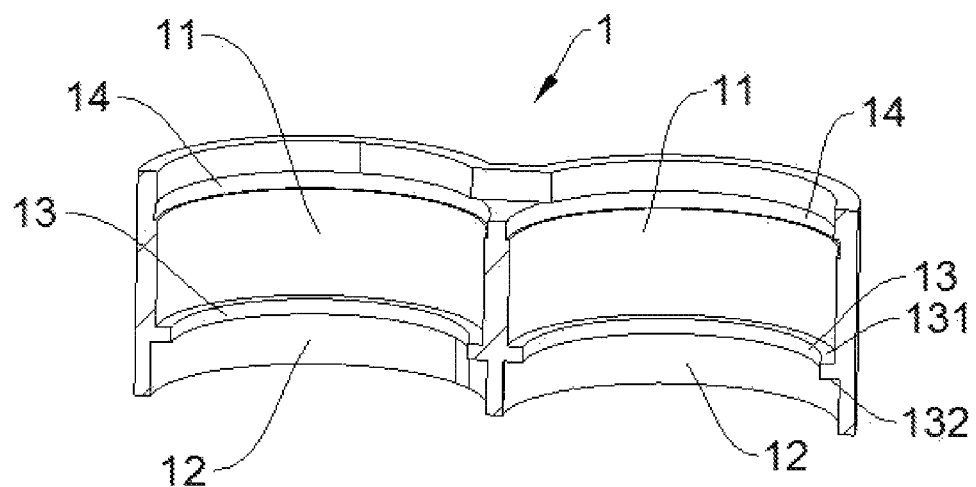
FIG. 4 is a cross sectional view of the housing of FIG. 3.

Referring to FIG. 4 and FIG. 6, each of the first receiving room 10a and the second receiving room 10b includes an upper cavity 11, a lower cavity 12 and a spacer 13 separating the upper cavity 11 from the lower cavity 12. All of the yoke iron, 21 the permanent magnet 22 and the pole 23 closely arranged in the upper cavity 11 from top to bottom, and a lower portion 231 of the pole 23 is connected with a top surface 131 of the spacer 13.

All of the dome 25, the ring 26 and the cover 27 are installed in the lower cavity 12 from top to bottom. An upper surface 251 of the dome 25 is connected with a bottom surface 132 of the spacer 13 and a lower surface 252 of the dome 25 is connected with an upper portion 261 of the ring 26. The cover 27 and the ring 26 are spaced from each other. Both the ring 26 and the cover 27 are interference fit with the lower cavity 12. A space between the ring 26 and the cover 27 is provided for allowing the dome 25 to vibrate downward.

The voice coil 24 is protruding into the upper cavity 11 and interacted with the magnetic field generated by the permanent magnet 22 within the upper cavity 11.

Preferably, the upper cavity 11 includes a limiting recess 14. An edge of the base 211 is embedded into the limiting recess 14. In this way, the permanent magnet 22, the pole 23 and the yoke iron 21 can be quickly fixed in the upper cavity 11. During installation, the pole 23 is first received in the upper cavity 11 and resisted against the top surface 131 of the spacer 13, and then the permanent magnet 22 is positioned into the upper cavity 11 to resist against the pole 23. Finally, the yoke iron 21 is positioned into the upper cavity 11 to resist against the permanent magnet 22, and the base 211 of the yoke iron 21 is embedded into the limiting recess 14 to clamp the yoke iron 21, the permanent magnet 22 and the pole 23.

Preferably, the PCB 3 includes a connecting board 31 formed in a middle portion thereof, and a pair of circular boards 32 formed on two opposite ends of the connecting board 31. The pair of circular boards 32 is respectively received in the first receiving room 10a and the second receiving room 10b and positioned above the base 211 of the yoke iron 21. In this way, a height and a volume of the housing 1 can be reduced.

Furthermore, each circular board 32 includes a first through-hole 33 passing therethrough along an axial direction of the speaker monomer 100, and the post 212 includes a second through-hole 2121 passing therethrough along the axial direction of the speaker monomer 100 and coaxially connected with the first through-hole 33. The first through-hole 33 is connected with the second through-hole 2121 to directly connect with an upper part of the dome 25 so as to conveniently connect the voice coil 24 with wires and internal heat dissipation of the housing 1.

Preferably, the housing 1 further includes a pair of installing recesses 15 respectively formed on a corresponding outer sidewall of the first receiving room 10a and the second receiving room 10b. The installing recess 15 is provided for quickly installing the speaker monomer 100 of the present disclosure into a shell of the ear-in earphone.

Figure 7:
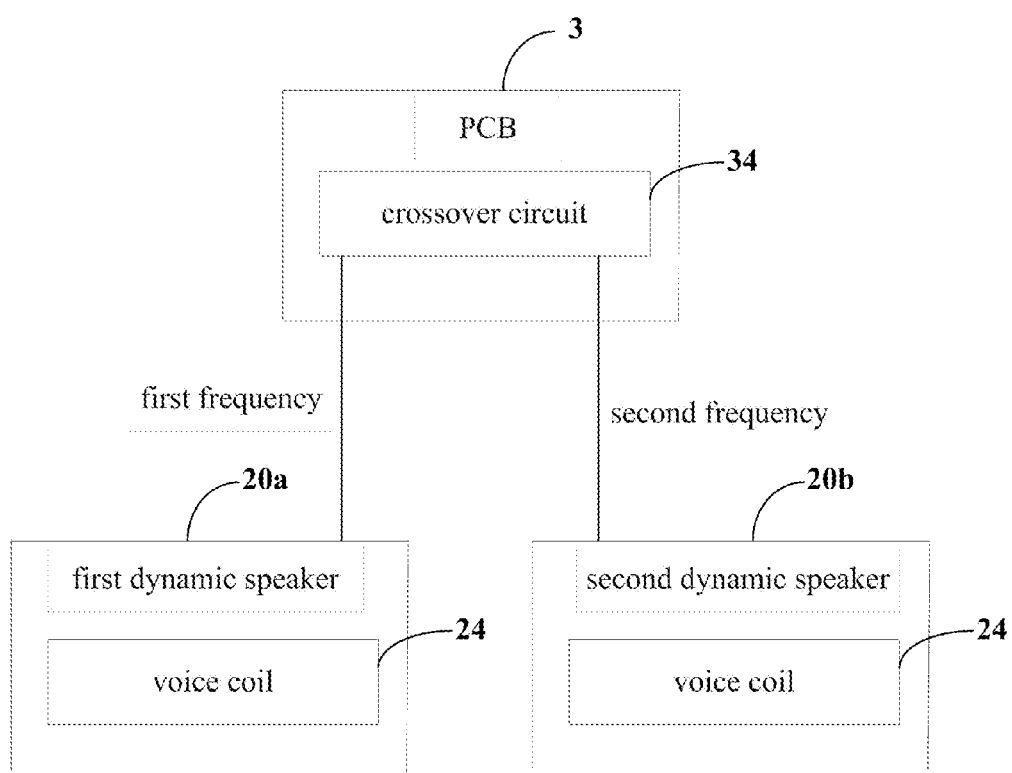
FIG. 7 is a circuit diagram of the speaker monomer with a pair of dynamic speakers thereof of FIG. 1.

Referring to FIG. 7, the PCB 3 further includes a crossover circuit 34 configured to transform an input audio signal into signals with different frequencies and then send the signals with different frequencies to the first dynamic speaker 20a and the second dynamic speaker 20b, respectively. For example, a signal with a low frequency is sent to the first dynamic speaker 20a to produce an audio with the low frequency, and a signal with a middle and high frequency is sent to the second dynamic speaker 20b to produce an audio with a high frequency. Or, the signal with the low frequency is sent to the second dynamic speaker 20b to produce the audio with the low frequency, and the signal with the middle and high frequency is sent to the first dynamic speaker 20a to produce the audio with the high frequency. The crossover circuit 34 is provided for enabling the first and second dynamic speakers 20a, 20b within the speaker monomer 100 of the present disclosure to produce audio with different frequencies, thus improving an overall sound quality of the ear-in earphone.

The present disclosure is provided that a pair of dynamic speakers is received in a speaker monomer 100 and the pair of dynamic speakers is configured to share a same housing 1 and a same PCB 3 for audio playback, so that only one installation position of the speaker monomer 100 can be needed in the single-side ear-in earphone to reduce the volume of the ear-in earphone. At the same time, the single-side ear-in earphone is only needed to install the speaker monomer 100 once, which can improve installation efficiency and product yield of the product.

Although the features and elements of the present disclosure are described as embodiments in particular combinations, each feature or element can be used alone or in other various combinations within the principles of the present disclosure to the full extent indicated by the broad general meaning of the terms in which the appended claims are expressed.

What is claimed is:

1. A speaker monomer with a pair of dynamic speakers thereof comprising:
   a housing, with a double-barrel-shaped configuration, comprising a first receiving room and a second receiving room arranged in parallel and separated from the first receiving room;
   an electro-acoustic conversion member received in the housing and comprising a first dynamic speaker received in the first receiving room, and a second dynamic speaker received in the second receiving room; and a PCB installed in an end portion of the housing and electrically connected to the first dynamic speaker and the second dynamic speaker;

wherein each of the first dynamic speaker and the second dynamic speaker comprises a yoke iron, a permanent magnet, a pole, a voice coil electrically connected to the PCB, a dome, a ring and a cover successively received in the first and second dynamic speakers from top to bottom; both the permanent magnet and the pole are hollow inside to form a moving chamber therein, the voice coil fixed on the dome and embedded into the moving chamber the yoke iron comprising a base closely arranged on the permanent magnet, and a post protruding downward from the base, received in the moving chamber and surrounded by the voice coil; each of the first receiving room and the second receiving room comprises an upper cavity, a lower cavity and a spacer separating the upper cavity from the lower cavity, and all of the yoke iron, the permanent magnet and the pole arranged in the upper cavity from top to bottom, and a lower portion of the pole connected with a top surface of the spacer all of the dome, the ring and the cover installed in the lower cavity from top to bottom, an upper surface of the dome connected with a bottom surface of the spacer and a lower surface of the dome connected with an upper portion of the ring, the cover and the ring spaced from each other, and the voice coil extending into the upper cavity.

2. The speaker monomer as claimed in claim 1, wherein a cross section of the housing is in a shape of "8".

3. The speaker monomer as claimed in claim 1, wherein the upper cavity comprises a limiting recess, an edge of the base embedded into the limiting recess.

4. The speaker monomer as claimed in claim 1, wherein the PCB comprises a connecting board formed in a middle portion thereof, and a pair of circular boards formed on two opposite ends of the connecting board and respectively received in the first receiving room and the second receiving room and positioned above the base of the yoke iron.

5. The speaker monomer as claimed in claim 4, wherein the pair of circular boards comprises a first through-hole passing therethrough along an axial direction of the speaker monomer, and the post comprises a second through-hole passing therethrough along the axial direction of the speaker monomer and coaxially connected with the first through-hole.

6. The speaker monomer as claimed in claim 1, wherein the housing further comprises a pair of installing recesses respectively formed on a corresponding outer sidewall of the first and second receiving rooms.

7. The speaker monomer as claimed in claim 1, wherein the PCB further comprises a crossover circuit configured to transform an input audio signal into signals with different frequencies and then send the signals with different frequencies to the first dynamic speaker and the second dynamic speaker, respectively.

* * * * *